United States Patent [19]

Marx et al.

[11] Patent Number: 5,760,426
[45] Date of Patent: Jun. 2, 1998

[54] HETEROEPITAXIAL SEMICONDUCTOR DEVICE INCLUDING SILICON SUBSTRATE, GAAS LAYER AND GAN LAYER #13

[75] Inventors: Diethard Marx; Zempei Kawazu; Norio Hayafuji, all of Tokyo, Japan

[73] Assignee: Mitsubishi Denki Kabushiki Kaisha, Tokyo, Japan

[21] Appl. No.: 680,850

[22] Filed: Jul. 16, 1996

[30] Foreign Application Priority Data

Dec. 11, 1995 [JP] Japan ................. 7-321725

[51] Int. Cl.⁶ ................................. H01L 29/26
[52] U.S. Cl. ........................ 257/190; 257/200
[58] Field of Search ................... 438/933, 938; 257/190, 200, 201

[56] References Cited

U.S. PATENT DOCUMENTS 5,239,188  8/1993  Takeuchi et al. ............. 257/76
5,290,393  3/1994  Nakamura ................... 156/613

OTHER PUBLICATIONS

R. D. Bringans, et al. "Formation of the Interface between GaAs and Si: Implications for GaAs–on–Si Heteroepitaxy," Apl. Phys. Lett. vol. 51, No. 7, pp. 523–525.

Liu et al., "Large Area Growth of GaN Thin Films in a Multi–Wafer Rotating Disk Reactor", Inst. Phys. Conf. Ser. No. 141, Chapter 2, pp. 119–124.

Oberman et al., "Molecular Beam Epitaxy of Gallium Nitride by Electron Cyclotron Resonance Plasma and Hydrogen Azide", Journal of Crystal Growth, 150 (1995), pp. 912–915.

Primary Examiner—Donald Monin
Assistant Examiner—John Guay
Attorney, Agent, or Firm—Leydig, Voit & Mayer, Ltd.

[57] ABSTRACT

A semiconductor device includes an Si substrate, a stress absorbing layer of GaAs and disposed on the Si substrate, a buffer layer having a composition of $Al_xGa_{1-x-y}In_yN$ ($0 \leq x \leq 1$, $0 \leq y \leq 1$) and disposed on the stress absorbing layer, and a compound semiconductor layer having a composition of $Al_xGa_{1-x-y}In_yN$ ($0 \leq x \leq 1$, $0 \leq y \leq 1$) and disposed on the buffer layer. Therefore, the buffer layer protects the GaAs stress absorbing layer from high temperatures during the formation of the compound semiconductor layer, whereby the stress absorbing layer is prevented from decomposition. As a result, a stress due to lattice mismatch or thermal stress between the Si substrate and the compound semiconductor layer is absorbed in the GaAs stress absorbing layer having a lowest bulk modulus, whereby a compound semiconductor layer with reduced dislocations may be grown on the buffer layer and bending of the Si substrate prevented.

5 Claims, 8 Drawing Sheets

HETEROEPITAXIAL SEMICONDUCTOR DEVICE INCLUDING SILICON SUBSTRATE, GAAS LAYER AND GAN LAYER #13

FIELD OF THE INVENTION

The present invention relates to a semiconductor device having high quality semiconductor crystal films comprising GaN or GaN related compounds on an Si substrate and a method of fabricating the semiconductor device.

BACKGROUND OF THE INVENTION

Growth methods used to deposit high quality GaN films can be distinguished into two groups.

A first group contains methods like MOCVD (metal organic chemical vapor deposition) and modifications of the MOCVD method like plasma assisted MOCVD. All methods of this group are characterized by a typical reactor pressure of 10 hPa to 1030 hPa and a growth temperature for high quality GaN in a range from 500° C. to 1100° C. The mechanism that controls the growth of GaN includes vapor phase chemical reactions and chemical reactions between a substrate surface and a semiconductor film surface.

A second group contains methods like MBE (molecular beam epitaxy) and related methods like GSMBE (gas source MBE), CBE (chemical beam epitaxy), and MOMBE (metal organic MBE). This second group is different from the MOCVD group because of lower reactor pressures below 0.001 hPa and the absence of vapor phase reactions.

FIG. 8 is a schematic view illustrating typical growth procedures in MOCVD. In FIG. 8, reference numeral 30 designates a sapphire substrate, numeral 31 designates a reactor, numeral 32 designate a susceptor, numeral 33 designates a heater, numeral 34 designates a reaction gas injection pipe, numeral 35 designates an injection subpipe, numeral 36 designates an exhaust pump, numeral 37 designates a motor, and numeral 38 designates an exhaust pipe.

During the whole procedure the reactor 31 is kept at a pressure of 1030 hPa. A GaN epitaxial layer is grown to have a thickness of 4 µm on the sapphire substrate 30 in accordance with the following steps. Initially, the cleaned sapphire substrate 30 having a diameter of 2 inches is disposed on the susceptor 32. Next, the air in the reactor 31 made of stainless steel is sufficiently exhausted by the exhaust pump 36, and $H_2$ gas is introduced into the reactor 31, thereby replacing the air in the reactor 31 with $H_2$ gas. Thereafter, the susceptor 32 is heated up to 1060° C. by the heater 33 while $H_2$ gas is supplied to the reactor 31 from the reaction gas injection pipe 34 and the injection subpipe 35 in the upper portion of the reactor 31. This state is maintained for 10 minutes to remove an oxide film from the surface of the sapphire substrate 30. Then, the temperature of the susceptor 32 is decreased to 500° C., and the sapphire substrate 30 is left to stand until the temperature becomes stable.

Subsequently, a gas mixture of $H_2$ gas and $N_2$ gas is supplied from the injection subpipe 35, and a gas mixture of ammonia ($NH_3$) gas and $H_2$ gas is supplied from the reaction gas injection pipe 34. The flow rate of each of the $H_2$ gas and the $N_2$ gas supplied from the injection subpipe 35 is 10 liter/min, and the flow rates of the $NH_3$ gas and the $H_2$ gas supplied from the reaction gas injection pipe 34 are 4 liter/min and 1 liter/min, respectively. This state is maintained until the temperature of the susceptor 32 is stabilized at 500° C.

Thereafter, in order to form a buffer layer, TMG (trimethylgallium) gas is flowed at a flow rate of $2.7 \times 10^{-5}$ mol/min for one minute in addition to the $NH_3$ gas and the $H_2$ gas is supplied from the reaction gas injection pipe 34. Subsequently, only the TMG gas is stopped to stop the growth of the buffer layer. As a result, a buffer layer having a thickness of 0.02 µm is produced.

The temperature of the susceptor 32 is increased to 1020° C. while flowing the other gases. After the temperature of the susceptor 32 is raised to 1020° C., TMG gas is flowed at a flow rate of $5.4 \times 10^{-5}$ mol/min for 60 minutes, in addition to the $NH_3$ gas and the $H_2$ gas supplied from the reaction gas injection pipe 34, thereby growing a GaN epitaxial layer having a thickness of 4.0 µm.

During the growth, under the conditions described above, the $H_2$ gas and the $N_2$ gas are constantly supplied from the injection subpipe 35, so that the interior of the reactor 31 is not contaminated with the reaction gas. In addition, the susceptor 32 is rotated at a rate of 5 rpm by the motor 37 so as to uniformly grow crystals. While the gases are supplied, the supplied gases are exhausted from the exhaust pipe 38 which is branched from piping of the exhaust pump 36.

As described above, a GaN buffer layer having a thickness of 0.02 µm and a GaN epitaxial layer having a thickness of 4.0 µm are grown on the sapphire substrate 30 (Reference data are given in U.S. Pat. No. 5,290,393).

FIG. 9 is a schematic view of a high-speed rotating disc MOCVD reactor used for another MOCVD, described in Institute of Physical Conference Serial No.141, (1994), p.119. In FIG. 9, reference numeral 39 designates an MOCVD reactor, numeral 40 designates a nitrogen source distribution manifold, numeral 41 designates a Group III distribution manifold, numeral 42 designates a regulating needle valve, numeral 43 designates a screen, and numeral 44 designates a wafer carrier.

The MOCVD reactor 39 is different from the reactor shown in FIG. 8 in several aspects. First, all gases are supplied from the top. The nitrogen gas is distributed by the nitrogen source distribution manifold 40 separated from the Group III source material gases which are supplied by the Group III distribution manifold 41. The flow distribution of all gases is optimized by adjusting the regulating needle valves 42. Further, a uniform flow of hydrogen is supplied from the screen 43. The gases reach substrates (not shown) mounted on the wafer carrier 44 and react to form the desired semiconductor films. To improve the homogeneity of the film, a high speed rotation (500~1000 rpm) is given to the wafer carrier 44. Operating pressure of the reactor 39 is preferably in the range of 76–200 torr (about 10–26 hPa). In addition, high quality GaN can be grown on the thin GaN buffer layer at high growth temperatures, typically about 1030° C., and the GaN buffer layer is deposited at a reactor pressure of 200 torr (about 26 hPa) at a temperature of 540° C. using $NH_3$ gas and TMG gas.

FIG. 10 is a schematic view of an MBE chamber for explaining a typical MBE process used for the growth of GaN, described in Journal of Crystal Growth 150 (1995), p.912. In FIG. 10, reference numeral 45 designates a high vacuum MBE chamber, numeral 46 designates a substrate, numeral 47 designates a gas-injector, numeral 48 designates an MBE-furnace, numeral 49 designates an electron diffraction device, and numeral 50 designates a substrate heater.

GaN grown by the MBE or related methods are grown by the following steps. Initially, a substrate 46 is transferred into the high vacuum MBE chamber 45 and thermally annealed at high temperatures, typically about 900° C., without any gas exposure. Next, the substrate 46 is nitrided at substrate temperatures, typically 400° C., by exposure of the substrate 46 to the nitrogen source gas through the gas-injector 47. A low temperature buffer layer of either GaN or AlN is deposited by introducing the Ga-source beam, which can be a beam of atomic gallium from the MBE-furnace 48 or a metal organic gallium precursor like TEG (triethylgallium) or TMG, which is introduced also by a suitable gas-injector. Finally, a high quality GaN layer is deposited at a high temperature in a range from 600° C.~860° C. An advantage of this method is the possibility for in-situ analysis of the film quality by the electron-diffraction device (RHHED) 49. The most favorite precursors for nitrogen are $NH_3$, precracked $H_2$ and $NH_3$, while for Ga most often TMG or TEG is used. Carrier gas is preferably a mixture of $N_2$ and $H_2$. Further, in MBE-related methods, nitrogen radicals or atoms can be produced by ECR plasma, microwave activation of $N_2$, or thermal cracking of $NH_3$.

Next, the most commonly used substrates and grown structures, which are used to obtain high quality GaN compound films will be explained (Reference data are given in U.S. Pat. No. 5,290,393). The most commonly used substrates for the growth of GaN compounds are sapphire and SiC wafers.

FIG. 11 is a cross-sectional view schematically illustrating one possible structure to produce high quality GaN compounds. In FIG. 11, reference numeral 60 designates a sapphire or SiC substrate, numeral 61 designates a low temperature GaAlN buffer layer of the chemical composition $Ga_xAl_{x-1}N$, and numeral 62 designates a GaAlN compound semiconductor layer of the chemical composition $Ga_xAl_{x-1}N$.

Initially, after a suitable cleaning procedure, a low temperature $Ga_xAl_{x-1}N$ ($0 \leq x \leq 1$) buffer layer 61 is deposited on the sapphire or SiC substrate 60 at a low temperature in a range from 200° C. to 700° C. to have a film thickness of 10 nm to 200 nm. The low temperature buffer layer 61 is amorphous rather than mono-crystalline. Next, the substrate temperature is increased in order to transform the amorphous low temperature buffer layer 61 into a smooth mono-crystalline layer, which is used as a substrate for the following growth of a $Ga_xAl_{x-1}N$ ($0 \leq x \leq 1$) compound semiconductor layer 62. The compound semiconductor layer 62 is deposited at a temperature in a range from 700° C. to 1150° C. and exhibits high quality optical and electrical characteristics.

However, the main problems related to the common way of growth of high quality GaN using sapphire or SiC substrates are the following:

a) high price of substrates with typical prices for sapphire, size of 2 inches diameter: 65~240 $/wafer, SiC, size 1 cm×1 cm: 200 $/piece.

b) the lattice mismatch between GaN and SiC is about 3.5% while for sapphire it is very large, about 16%.

c) problems related only to sapphire: as an insulator the substrate cannot be used for back-side contacts. Therefore, the process to form contacts is more expensive. Thermal expansion coefficient of sapphire differs largely from that of GaN, which further complicates growth processes. Because of the Wurtzite crystal structure of sapphire further difficulties are found for the cleaving of samples, which is necessary for the production of laser devices.

A few reports are given to overcome these problems. For example, FIG. 12 is a cross-sectional view illustrating a semiconductor device in which GaN compound semiconductor layers are grown on an Si substrate, described in U.S. Pat. No. 5,239,188. In FIG. 12, the structure includes a low cost n type Si (111) substrate 63 with a low resistance. On the substrate 63, a low temperature AlN buffer layer 64 is deposited in the common way. A high quality n type GaN layer 65 and a p type GaN layer 66 are successively disposed on the low temperature AlN buffer layer 64 at high temperatures. Reference numeral 67 designates a p side electrode and numeral 68 designates an n side electrode. The Si substrate 65 solves the problems related to the substrate price and the sapphire substrate. However, since the lattice mismatch between Si and GaN is as high as about 20%, new problems occur related to the high lattice mismatch. That is, in the structure shown in FIG. 12, the softest layers remain the GaN layers 65 and 66 and the Si substrate 63, and a high number of dislocations are still observed in the GaN layers 65 and 66. Further, the stress in the Si substrate can lead to the bending of the wafer, which limits the use of this technique drastically.

Another attempt to overcome the above-described problems is described by Ueta et al. in Materials Research Society vol. 339 (1994), p.459. They also used Si substrates and introduced a GaAs layer before the deposition of a GaN layer. Since the dislocations tend to form in the material that has a smaller bulk modulus, a high number of dislocations are produced in the GaAs layer having a bulk modulus smaller than that of the GaN layer, whereby the dislocations in the GaN layer are reduced. However, their research does only investigated rather thick GaAs layers in the range of 200 nm~2000 nm, and the optimized growth conditions of the GaAs layer, such as the optimum thickness of the GaAs layer and the method of protecting the GaAs layer which is easily decomposed at high temperatures, are not given.

SUMMARY OF THE INVENTION

It is an object of the present invention to provide a semiconductor device in which a stress absorbing layer having superior stress absorption is disposed between an Si substrate and a GaN compound semiconductor layer, or a GaN compound buffer layer is disposed on the stress absorbing layer, whereby the quality of the GaN compound semiconductor layer is improved and unwanted bending of the Si substrate is prevented.

It is another object of the present invention to provide a method of fabricating a semiconductor device in which high quality GaN compound semiconductor layers are formed on an Si substrate by optimizing the growth conditions of the stress absorbing layer and the GaN compound buffer layer.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises an Si substrate, a stress absorbing layer comprising GaAs and disposed on the Si substrate, a compound buffer layer having a composition of $Al_xGa_{1-x-y}In_yN$ ($0 \leq x \leq 1$, $0 \leq y \leq 1$) and disposed on the stress absorbing layer, and a compound semiconductor layer having a composition of $Al_xGa_{1-x-y}In_yN$ ($0 \leq x \leq 1$, $0 \leq y \leq 1$) and disposed on the buffer layer. Therefore, the buffer layer protects the GaAs stress absorbing layer from high temperatures during the formation of the compound semiconductor layer, whereby the stress absorbing layer is prevented from decomposition. As a result, a stress due to the lattice mismatch between the Si substrate and the compound semiconductor layer is absorbed in the GaAs stress absorbing layer having a lowest bulk modulus, whereby the compound semiconductor layer with reduced dislocations is grown on the buffer layer and bending of the Si substrate is prevented.

According to a second aspect of the present invention, in the semiconductor device, the stress absorbing layer is as thin as 1 nm~300 nm. Therefore, when GaN compounds are grown on the buffer layer, defects in the buffer layer is reduced in a range where the buffer layer is thin, thereby reducing defects in the compound semiconductor layer.

According to a third aspect of the present invention, a semiconductor device comprises an Si substrate, low bonding power layers comprising a material which has a bonding number smaller than that of Si and disposed on regions of the Si substrate, a stress absorbing layer comprising GaAs and disposed on the low bonding power layers and on the Si substrate where the low bonding power layers are not present, and a compound semiconductor layer having a composition of $Al_xGa_{1-x-y}In_yN$ ($0 \leq x \leq 1$, $0 \leq y \leq 1$) and disposed on the stress absorbing layer. Therefore, the bonding power between the low bonding power layer having a bonding number smaller than those of the Si substrate and the stress absorbing layer is smaller than the bonding power between the Si substrate and the stress absorbing layer. Further, the stress between the low bonding power layer and the stress absorbing layer is absorbed and the stress between the stress absorbing layer and the Si substrate is reduced. As a result, bending of the Si substrate and generation of cracks in the substrate are suitably prevented.

According to a fourth aspect of the present invention, in the semiconductor device, a compound buffer layer having a composition of $Al_xGa_{1-x-y}In_yN$ ($0 \leq x \leq 1$, $0 \leq y \leq 1$) is disposed on the stress absorbing layer, and a compound semiconductor layer is disposed on the buffer layer. Therefore, the buffer layer protects the stress absorbing layer from high temperatures during the formation of the compound semiconductor layer, whereby the stress absorbing layer is prevented from decomposition.

According to a fifth aspect of the present invention, in the semiconductor device, since the low bonding power layer comprises one selected from the groups consisting of $SiO_x$, $SiN_x$, or SiON, the low bonding power layer is easily formed by oxidizing or nitriding the Si substrate.

According to a sixth aspect of the present invention, a semiconductor device comprises an Si substrate, a stress absorbing layer comprising As and disposed on the Si substrate, a compound buffer layer having a composition of $Al_xGa_{1-x-y}In_yN$ ($0 \leq x \leq 1$, $0 \leq y \leq 1$) and disposed on the stress absorbing layer, and a compound semiconductor layer having a composition of $Al_xGa_{1-x-y}In_yN$ ($0 \leq x \leq 1$, $0 \leq y \leq 1$) and disposed on the buffer layer. Therefore, the buffer layer protects the As stress absorbing layer from high temperatures during the formation of the compound semiconductor layer, whereby the stress absorbing layer is prevented from decomposition. As a result, a stress due to lattice mismatch between the Si substrate and the compound semiconductor layer is absorbed in the As stress absorbing layer having a lowest bulk modulus, whereby the compound semiconductor layer with reduced dislocations is grown on the buffer layer, and bending of the Si substrate is prevented.

According to a seventh aspect of the present invention, in the semiconductor device, the Si substrate has a {100} surface orientation or a {111} surface orientation. Therefore, when the Si substrate has the {100} surface, the substrate can be cleaved, on the other hand, when the Si substrate has the {111} surface, the Si substrate has the same Wurtzite like crystal structure as the nitride buffer layer, whereby crystallinity of the nitride buffer layer is improved.

According to an eighth aspect of the present invention, in the semiconductor device, the Si substrate, the stress absorbing layer, and the buffer layer comprise impurities for producing conductivity, and the compound semiconductor layer comprises an impurity for producing conductivity and constitutes a light-to-electricity conversion or an electricity-to-light conversion device structure, and the compositions x and y have values corresponding to the device structure. Therefore, the present invention can be applied to the semiconductor laser device, and inexpensive Si substrate is used, resulting in a semiconductor laser device with a low cost. In addition, since the Si substrate can be cleaved and the electrode can be formed on the rear surface of the substrate, additional processing is not required in the fabricating process of the semiconductor laser device, thereby obtaining a semiconductor laser device with a further reduced cost.

According to a ninth aspect of the present invention, a method of fabricating a semiconductor device comprises preparing an Si substrate, forming a stress absorbing layer comprising one selected from the groups consisting of GaAs or As and having an amorphous or polycrystalline structure on the Si substrate, forming a compound buffer layer having a composition of $Al_xGa_{1-x-y}In_yN$ ($0 \leq x \leq 1$, $0 \leq y \leq 1$) on the stress absorbing layer at a temperature such that the stress absorbing layer is not decomposed, partly transforming the stress absorbing layer and the buffer layer, at least a part of the buffer layer, into a monocrystalline structure, and forming a compound semiconductor layer comprising a monocrystalline structure and having a composition of $Al_xGa_{1-x-y}In_yN$ ($0 \leq x \leq 1$, $0 \leq y \leq 1$) on the buffer layer which is partly transformed into a monocrystalline structure. Therefore, the buffer layer is grown on the stress absorbing layer without decomposition of the stress absorbing layer and, further, the buffer layer protects the stress absorbing layer from high temperatures during the formation of the compound semiconductor layer, whereby the stress absorbing layer is prevented from decomposition. In addition, since the buffer layer which is formed in amorphous or polycrystalline structure at a low temperature is transformed into a monocrystalline structure, crystallinity of the compound semiconductor layer formed on the buffer layer is improved. Further, since the stress of the buffer layer is absorbed in the stress absorbing layer during this transformation, dislocations of the compound semiconductor layer formed on the buffer layer are reduced.

According to a tenth aspect of the present invention, in the method of fabricating the semiconductor device, the stress absorbing layer comprises GaAs and is formed at a temperature in a range from 200° C. to 600° C. Therefore, the GaAs stress absorbing layer is made amorphous or polycrystalline structure with high stability.

According to an eleventh aspect of the present invention, in the method of fabricating the semiconductor device, the stress absorbing layer comprises As and is formed at a temperature in a range from a room temperature to 550° C. Therefore, the As stress absorbing layer is made amorphous or polycrystalline structure with high stability.

DETAILED DESCRIPTION OF THE PREFERRED EMBODIMENTS

Embodiment 1.

Figure 1:
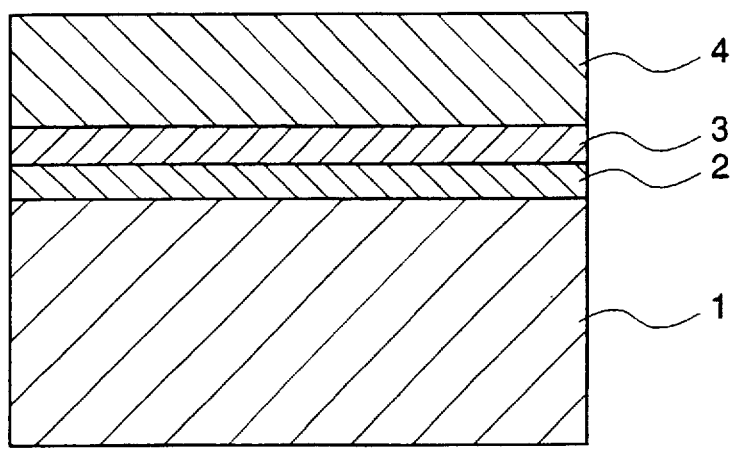
FIG. 1 is a cross-sectional view schematically illustrating a semiconductor device according to a first embodiment of the present invention.

FIG. 1 is a cross-sectional view schematically illustrating a semiconductor device according to a first embodiment of the present invention. Reference numeral 1 designates an Si substrate. A GaAs stress absorbing layer 2 is disposed on the Si substrate 1, a low temperature GaN buffer layer 3 is disposed on the stress absorbing layer 2, and a GaN compound semiconductor layer 4 is disposed on the low temperature GaN buffer layer 3. The GaN compound semiconductor layer 4 is a part of a desired device structure (not shown). That is, on the GaN compound semiconductor layer 4, other GaN compound semiconductor layers are disposed to form the device structure and, further, electrodes (not shown) for the device structure are disposed. In addition, the Si substrate 1 is desired to have a {100} surface orientation or a {111} surface orientation. That is, when the semiconductor device shown in FIG. 1 is a semiconductor laser, since it is necessary to cleave the Si substrate 1, the Si substrate 1 has a {100} surface orientation. On the other hand, when the semiconductor device is a device which does not require cleaving of the substrate, since Si and GaAs never have the Wurtzite structure, the Si substrate 1 has a {111} surface orientation so that it has the same Wurtzite like crystal structure as the buffer layer 3, thereby improving the crystallinity of the buffer layer 3 (after recrystallization).

Figure 2:
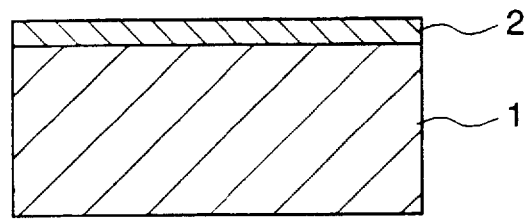
FIGS. 2(a)–2(c) are cross-sectional views illustrating process steps in a method of fabricating the semiconductor device according to the first embodiment of the present invention.
Figure 2:
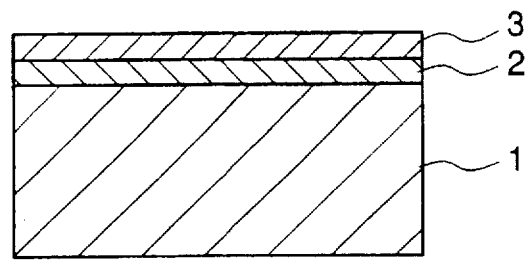
Figure 2:
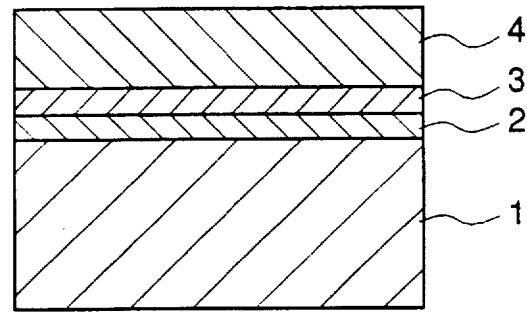

FIGS. 2(a)–2(c) are sectional views illustrating process steps in a method of fabricating the semiconductor device according to the first embodiment of the invention. In the figures, the same reference numerals as in FIG. 1 designate the same or corresponding parts.

A description is given of the fabricating method with reference to FIGS. 2(a)–2(c). Both MOCVD and MBE, and related methods described with respect to the prior art should be suitable.

Initially, an Si substrate 1 having a {100} surface orientation is prepared as in the prior art method, and the Si substrate 1 is disposed on a susceptor. Next, the Si substrate 1 is cleaned of residual impurities. As a cleaning method, a treatment with atomic hydrogen is used in MBE, and a high temperature process is used in the MOCVD related method.

In the step of FIG. 2(a), a GaAs stress absorbing layer 2 having an amorphous structure is deposited on the Si substrate 1 to a thickness of 1 nm to 300 nm at a substrate temperature in a range from 200° C. to 600° C. In the step of FIG. 2(b), on the GaAs stress absorbing layer 2, a GaN buffer layer 3 having an amorphous structure is deposited at a substrate temperature in a range from 200° C. to 700° C. so that the GaAs stress absorbing layer 2 is not decomposed. In this case, the GaAs stress absorbing layer 2 and the GaN buffer layer 3 may have polycrystalline structures. The substrate temperature is raised in order to transform the amorphous GaAs stress absorbing layer 2 and the amorphous GaN buffer layer 3 into monocrystalline layers, that is, in order to recrystallize these layers. Preferably, the recrystallization is performed at a temperature in a range from 500° C. to 1150° C. In this process, the crystal structure of the Si substrate forms a template for the crystal structure of the GaAs stress absorbing layer 2, and the crystal structure of the recrystallized GaAs stress absorbing layer forms a template for the crystal structure of the GaN buffer layer 3. During this process, most of the stress due to lattice mismatch between the Si substrate 1 and the GaN buffer layer 3 is absorbed in the softest layer, that is, the GaAs stress absorbing layer 2. When the substrate temperature exceeds 900° C., the uppermost GaN buffer layer 3 protects the GaAs stress absorbing layer 2 from decomposition.

Next, in the step of FIG. 2(c), a GaN compound semiconductor layer 4 is grown at temperatures above 900° C. for the case of MOCVD and related methods and above 600° C. for MBE and related methods, respectively. Thereafter, other GaN compound semiconductor layers (not shown) are grown to form a desired device structure, and electrodes (not shown) for the device are formed, thereby completing a semiconductor device. During the growth of the device structure, thermal stress, which accumulates, when the Si substrate 1 is cooled down, also should be absorbed in the GaAs stress absorbing layer 2.

In the prior art structure, since layer having smallest bulk modulus is a GaN layer and the defects (dislocations) propagate from the material with the higher bulk modulus into the material with the lower bulk modulus, the defects are not prevented from propagating to the GaN layer. However, in the semiconductor device according to the first embodiment, since the GaAs stress absorbing layer 2 with a bulk modulus lower than those of the Si substrate 1 and the GaN compound semiconductor layer 4 is disposed between the Si substrate 1 and the GaN compound semiconductor layer 4, stress due to lattice mismatch between the Si substrate 1 and the GaN compound semiconductor layer 4 is absorbed in the GaAs stress absorbing layer 2. Even if defects are produced in the GaAs stress absorbing layer 2 by the stress, the defects do not propagate to the GaN compound semiconductor layer 4, resulting in a GaN compound semiconductor layer 4 having reduced defects. Therefore, a low cost Si substrate 1 can be used for the GaN series device, whereby the price of the GaN series device is significantly reduced.

In the first embodiment of the invention, the amorphous or polycrystalline GaAs stress absorbing layer 2 is formed on the Si substrate 1 at a low temperature, and the GaN buffer layer 3 is formed on the GaAs stress absorbing layer 2 at a temperature in a range from 200° C. to 700° C. Therefore, the GaN buffer layer 3 is formed on the GaAs stress absorbing layer 2 without decomposition of the stress absorbing layer 2. In addition, the GaAs stress absorbing layer 2 is protected from high temperatures during the formation of the compound semiconductor layer 4 and prevented from decomposition.

Further, in the first embodiment of the invention, since the amorphous or polycrystalline GaAs stress absorbing layer 2 and the amorphous or polycrystalline GaN buffer layer 3 which are formed at low temperatures are recrystallized before the growth of the GaN compound semiconductor layer 4, crystallinity of the GaN compound semiconductor layer 4 grown on the GaN buffer layer 3 is improved, and stress of the GaN buffer layer 3 is absorbed in the stress absorbing layer 2 during the recrystallization, thereby reducing the defects in the compound semiconductor layer 4 formed on the buffer layer 3.

Further, since the GaN buffer layer 3 is recrystallized at a temperature in a range from 500° C., which is a temperature recrystallizing the amorphous or polycrystalline layers, to 1150° C., which is a growth temperature of the GaN compound semiconductor layer 4, the recrystallization of the GaN buffer layer 3 can be suitably performed.

Furthermore, since the GaAs stress absorbing layer 2 is as thin as 1~300 nm, defects in the GaN compound semiconductor layer 4 are significantly reduced.

Furthermore, the Si substrate has a {100} surface orientation or a {111} surface orientation. When the Si substrate 1 has a {100} surface, the substrate can be cleaved. On the other hand, when the Si substrate 1 has a {111} surface, the Si substrate has the same Wurtzite like crystal structure as the buffer layer 3, thereby improving the crystallinity of the buffer layer 3 during recrystallization.

Furthermore, since the GaAs stress absorbing layer 2 is formed at a temperature in a range from 200° C. to 600° C., the structure of the GaAs stress absorbing layer 2 is amorphous or polycrystalline with high reliability.

Further, since the GaAs stress absorbing layer 2, the low temperature GaN buffer layer 3, and the GaN compound semiconductor layer 4 are formed on the Si substrate 1 by any of MOCVD, MBE, and CBE, the semiconductor device is suitably fabricated.

Embodiment 2.

A description is given of a second embodiment of the present invention.

Figure 3:
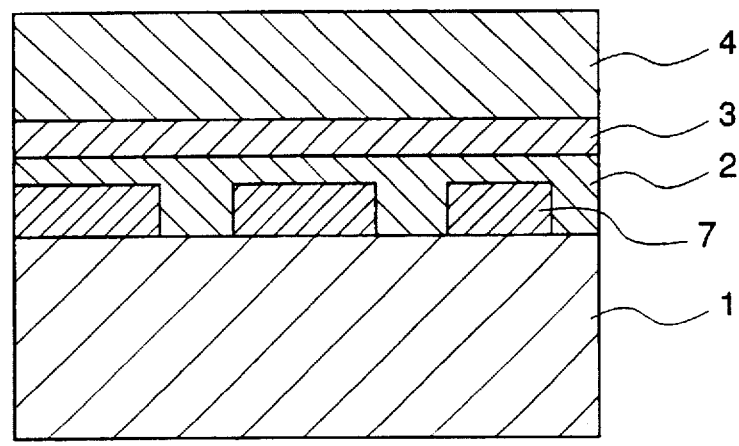
FIG. 3 is a cross-sectional view schematically illustrating a semiconductor device according to a second embodiment of the present invention.

FIG. 3 is a cross-sectional view schematically illustrating a semiconductor device according to a second embodiment of the present invention. In FIG. 3, the same reference numerals as in FIG. 1 designate the same or corresponding parts. Reference numeral 7 designates low bonding power layers comprising a dielectric material, such as $SiO_x$, $SiN_x$, and SiON, and disposed in prescribed regions on the Si substrate 1. A GaAs stress absorbing layer 2 is disposed on the low bonding power layers 7 and on a region of the Si substrate 1 other than the regions where these layers 7 are present.

Figure 4:
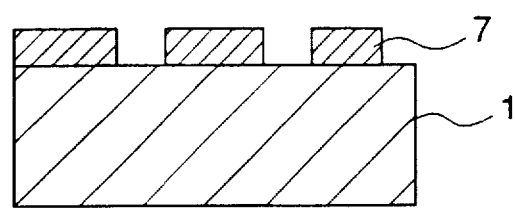
FIGS. 4(a)–4(d) are cross-sectional views illustrating process steps in a method of fabricating the semiconductor device according to the second embodiment of the present invention.
Figure 4:
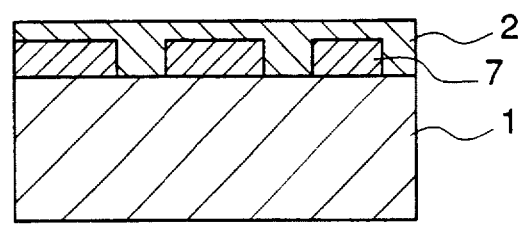
Figure 4:
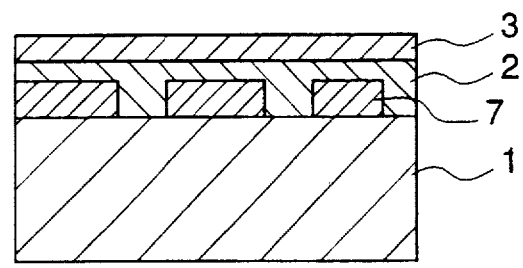
Figure 4:
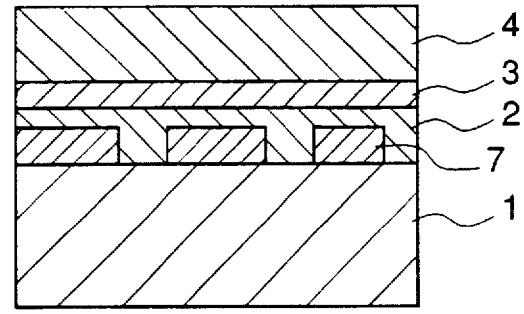

FIGS. 4(a)–4(d) are cross-sectional views illustrating process steps in a method of fabricating a semiconductor device according to a second embodiment of the invention. In the figures, the same reference numerals as in FIGS. 2(a)–2(c) and FIG. 3 designate the same or corresponding parts. In the step of FIG. 4(a), low bonding power layers 7 are formed on the Si substrate 1 by oxidizing or nitriding the Si substrate 1 using a prescribed pattern. In the step of FIG. 4(b), a stress absorbing layer 2 is formed on the low bonding power layers 7 and the Si substrate 1 and, thereafter, in the steps of FIGS. 4(c) and 4(d), the same process steps as already described with respect to the first embodiment are performed to fabricate the semiconductor device. A suitable pattern of the low bonding power layer 7 is a square or circular shape with dimensions of 0.2~2000 μm, and having a thickness of 10~100 nm. The width of the pattern of the low bonding power layer 7 must be such a width that the upper surface of the Si substrate 1 is widely exposed, whereby the crystal structure of the Si substrate 1 acts as a template for the crystal structure of the GaAs stress absorbing layer 2. In addition, the material of the low bonding power layer 7 is not restricted to $SiO_x$, $SiN_x$, and SiON. Another material may be used as long as it has a bonding number smaller than that of Si. However, when $SiO_x$, $SiN_x$, and SiON are used, the low bonding power layers 7 are easily formed on the Si substrate 1 by oxidizing or nitriding the Si substrate 1.

As described above, in the second embodiment of the invention, the low bonding power layers 7 comprising a dielectric material, such as $SiO_x$, $SiN_x$, and SiON, are formed at prescribed regions on the Si substrate 1, and the GaAs stress absorbing layer 2 is formed on the low bonding power layers 7 and on a region of the Si substrate 1 other than the regions where these layers 7 are present. Therefore, the bonding power between the low bonding power layer 7 having a bonding number smaller than those of the Si substrate 1 and the GaAs stress absorbing layer 2 is smaller than the bonding power between the Si substrate 1 and the GaAs stress absorbing layer 2. The stress between the low bonding power layer 7 and the stress absorbing layer 2 is absorbed and the stress between the stress absorbing layer 2 and the Si substrate 1 is reduced. As a result, bending of the Si substrate 1 and generation of cracks in the substrate are suitably prevented.

Further, since the GaN buffer layer 3 is formed on the GaAs stress absorbing layer 2 at a low temperature, the GaN buffer layer 3 is formed on the GaAs stress absorbing layer 2 without decomposition of the GaAs stress absorbing layer 2. In addition, the GaAs stress absorbing layer 2 is protected from high temperatures during the formation of the compound semiconductor layer 4 and prevented from decomposition.

Embodiment 3.

A description is given of a third embodiment of the present invention.

Figure 5:
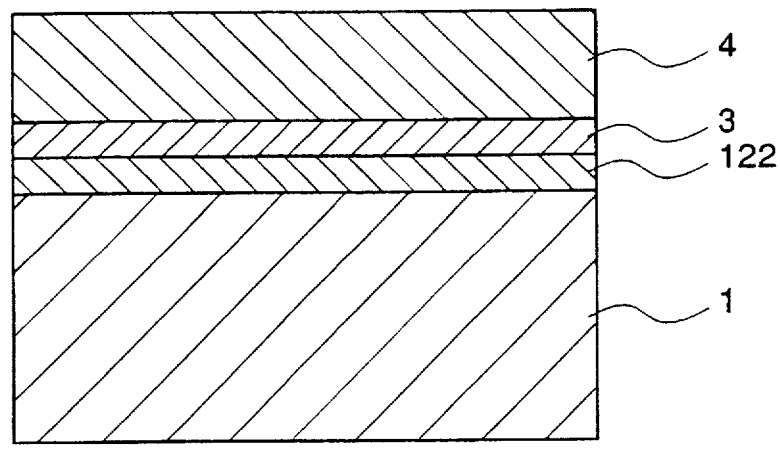
FIG. 5 is a cross-sectional view schematically illustrating a semiconductor device according to a third embodiment of the present invention.

FIG. 5 is a cross-sectional view schematically illustrating a semiconductor device according to a third embodiment of the present invention. In FIG. 5, the same reference numerals as in FIG. 1 designate the same or corresponding parts. Reference numeral 122 designates an As stress absorbing layer which is used instead of the GaAs stress absorbing layer 2 shown in FIG. 1. The semiconductor device according to this third embodiment is fabricated as described with respect to the first embodiment, except for the temperature for forming the As stress absorbing layer 122. The temperature for forming the As stress absorbing layer 122 is preferably in a range from room temperature to 550° C. so that the structure of the As stress absorbing layer 122 is amorphous or polycrystalline structure with high stability. Since As has a bulk modulus lower than those of the Si substrate 1 and the GaN compound semiconductor layer 4, As can be used as the stress absorbing layer as described with respect to GaAs. Further, since As is decomposed at a temperature for growing the GaN compound semiconductor layer 4 as described with respect to GaAs, a GaN buffer layer 3 as a protecting layer is necessary. In addition, since the As stress absorbing layer 122 is excessively soft and unstable when the layer is too thick, the thickness of the As stress absorbing layer 122 is preferably in a range from a few atomic layers to several nanometers.

As described above, in the third embodiment of the invention, since the As stress absorbing layer 122, the GaN buffer layer 3, and the GaN compound semiconductor layer 4 are successively formed on the Si substrate 1, the As stress absorbing layer 122 is protected from high temperatures during the formation of the compound semiconductor layer 4 and prevented from decomposition. Therefore, stress due to lattice mismatch between the Si substrate 1 and the compound semiconductor layer 4 is absorbed in the As stress absorbing layer 122 having the lowest bulk modulus, whereby a compound semiconductor layer 4 with reduced defects is grown on the GaN buffer layer 3, and bending of the Si substrate 1 can be prevented.

Embodiment 4.

A description is given of a fourth embodiment of the present invention.

Figure 6:
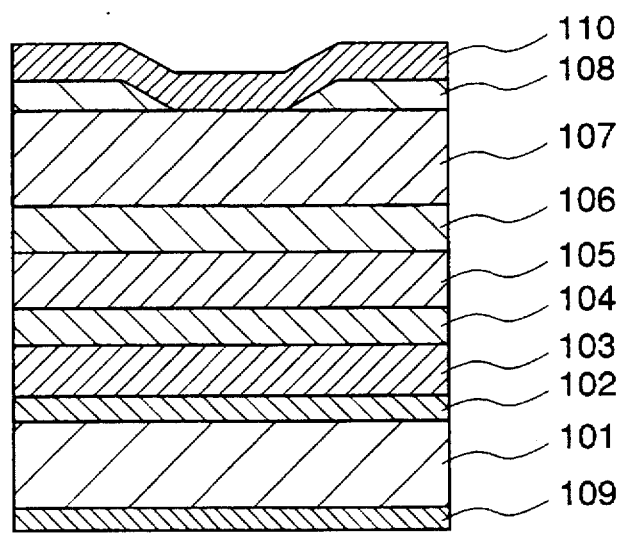
FIG. 6 is a cross-sectional view schematically illustrating a semiconductor laser device according to a fourth embodiment of the present invention.
Figure 7:
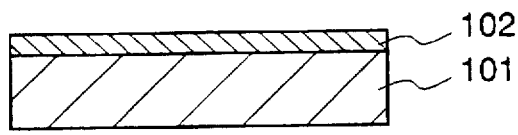
FIGS. 7(a)–7(g) are cross-sectional views illustrating process steps in a method of fabricating the semiconductor laser device according to the fourth embodiment of the present invention.
Figure 7:
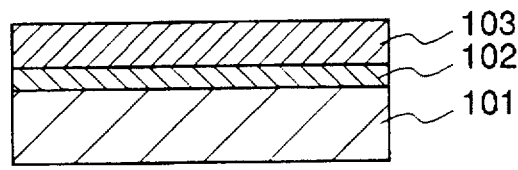
Figure 7:
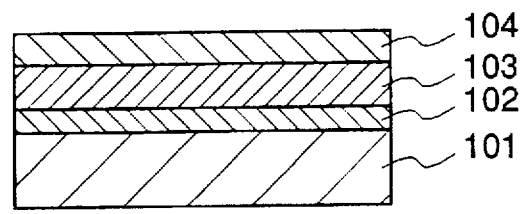
Figure 7:
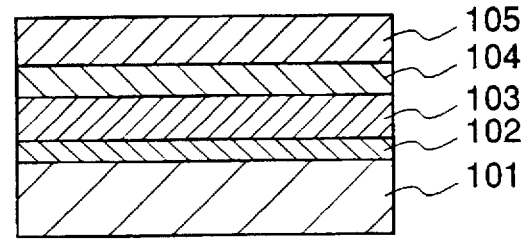
Figure 7:
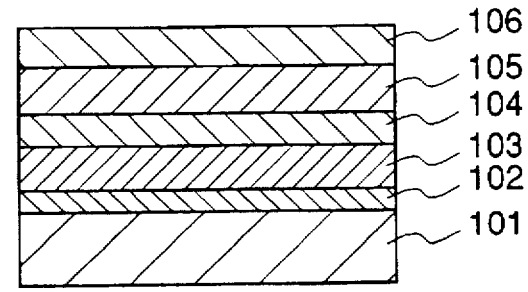
Figure 7:
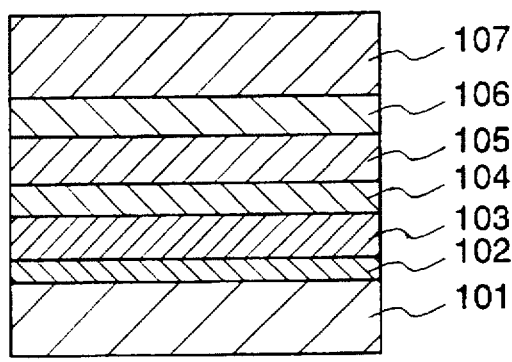
Figure 7:
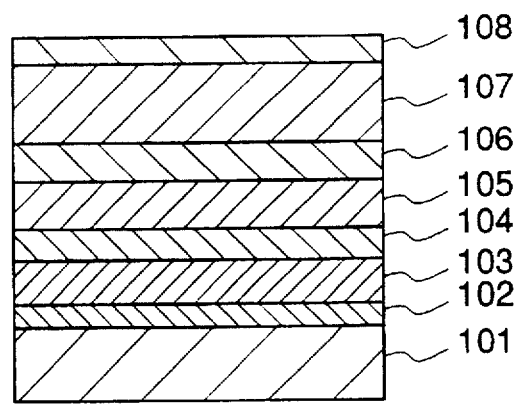
Figure 8:
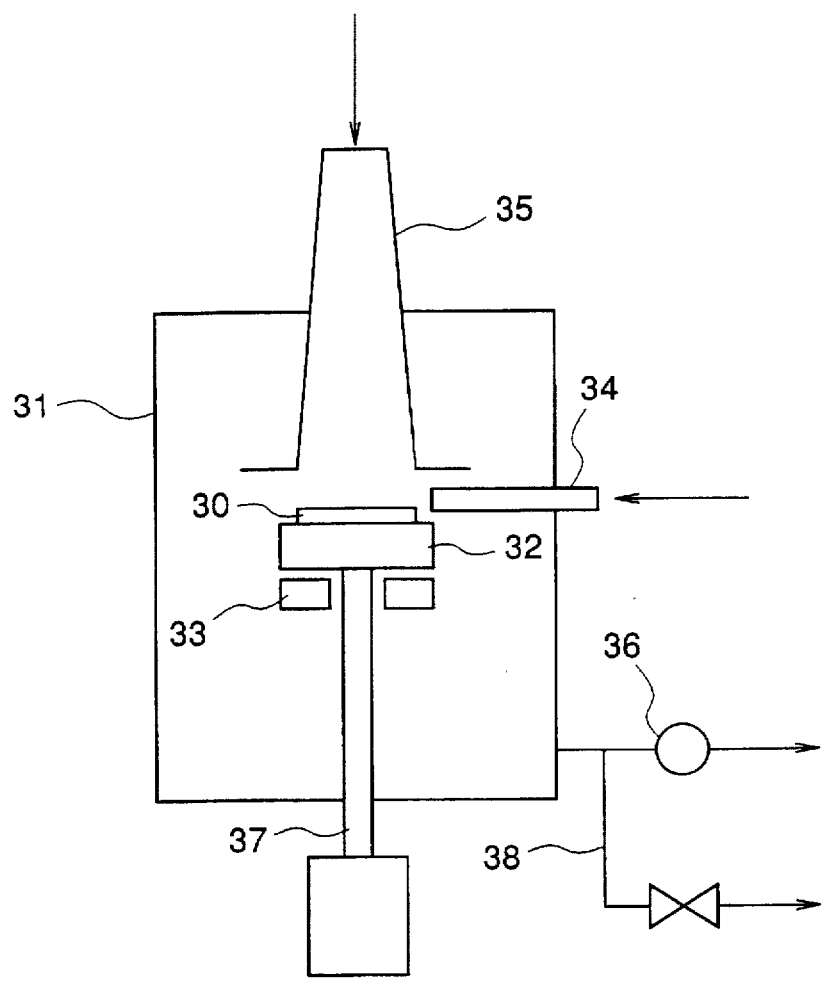
FIG. 8 is a schematic view illustrating typical growth procedures in MOCVD.
Figure 9:
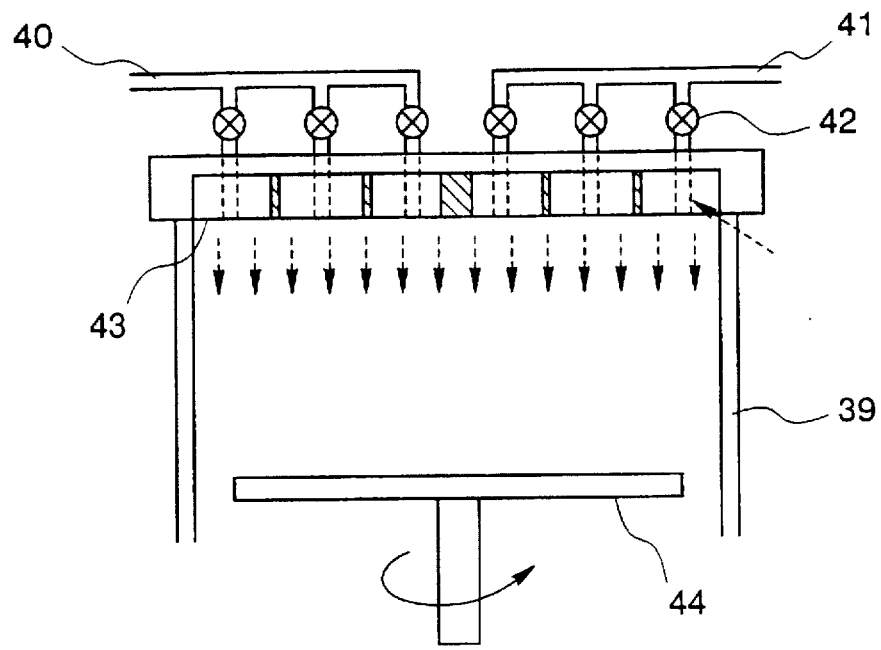
FIG. 9 is a schematic view of a high-speed rotating disc MOCVD process reactor used for another MOCVD.
Figure 10:
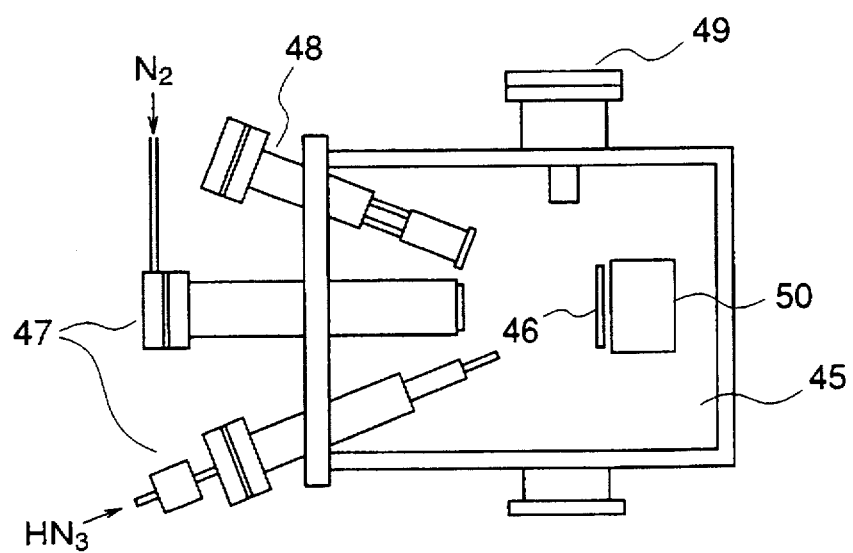
FIG. 10 is a schematic view of an MBE chamber for explaining a typical MBE used for the growth of GaN.
Figure 11:
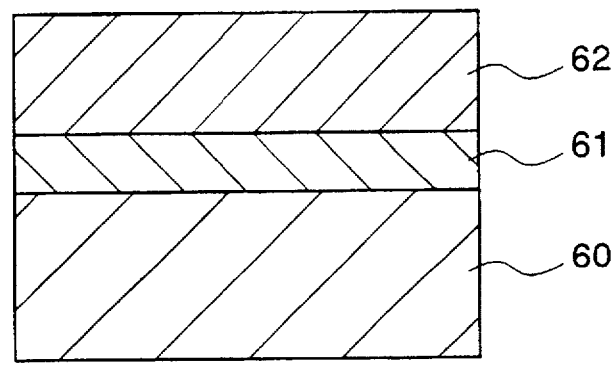
FIG. 11 is a cross-sectional view schematically illustrating a semiconductor device in which GaN compound semiconductor layers are grown on a sapphire substrate according to the prior art.
Figure 12:
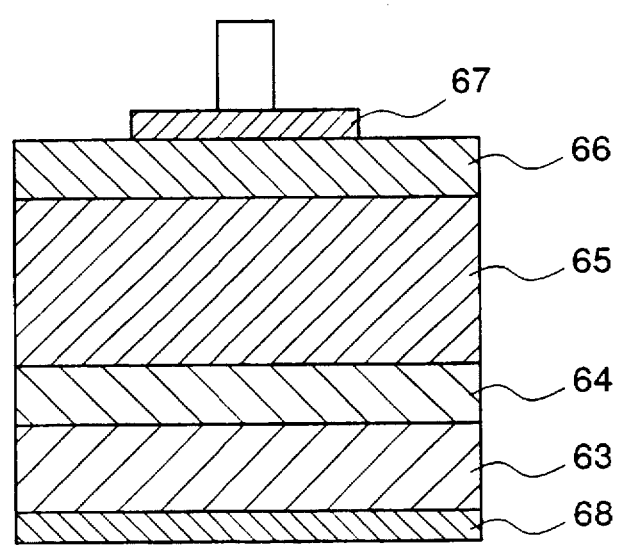
FIG. 12 is a cross-sectional view schematically illustrating a semiconductor device in which GaN compound semiconductor layers are grown on an Si substrate according to the prior art.

FIG. 6 is a cross-sectional view schematically illustrating a semiconductor laser device according to a fourth embodiment of the present invention. Reference numeral 101 designates an n type Si substrate. An n type GaAs stress absorbing layer 102 is disposed on the n type Si substrate 101. A low temperature n type GaN buffer layer 103 is disposed on the n type GaAs stress absorbing layer 102. An n type GaN buffer layer 104 is disposed on the low temperature n type GaN buffer layer 103. An n type AlGaInN cladding layer 105 is disposed on the n type GaN buffer layer 104. An undoped AlGaInN active layer 106 is disposed on the n type AlGaInN cladding layer 105. A p type AlGaInN cladding layer 107 is disposed on the undoped AlGaInN active layer 106. N type current blocking layers 108 are disposed on regions of the p type AlGaInN cladding layer 107. A p side electrode 110 is disposed on the n type current blocking layers 108 and on a region of the p type AlGaInN cladding layer 107 where the n type current blocking layers 108 are not present. An n side electrode 109 is disposed on the rear surface of the n type Si substrate 101.

FIGS. 7(a)–7(g) are cross-sectional views illustrating process steps in a method of fabricating a semiconductor laser device according to a fourth embodiment of the present invention. In these figures, the same reference numerals as in FIG. 6 designate the same or corresponding parts. In the fourth embodiment, since the device shown in FIG. 6 is the semiconductor laser device, it is necessary to cleave the n type Si substrate 101, whereby an n type Si substrate having a {100} surface orientation is used as the substrate 101. The same process steps as described with respect to the first embodiment are performed until the step of disposing the n type GaN buffer layer 104 shown in FIG. 7(c). Next, as shown in FIGS. 7(d)–7(g), the n type AlGaInN cladding layer 105, the undoped AlGaInN active layer 106, the p type AlGaInN cladding layer 107, and the n type current blocking layer 108 are successively disposed on the n type GaN buffer layer 104. Thereafter, the prescribed region of the n type current blocking layer 108 is etched and removed. Then the p side electrode 110 is formed on the n type current blocking layers 108 and on a region of the p type AlGaInN cladding layer 107 where the n type current blocking layers 108 are not present and the n side electrode 109 is formed on the rear surface of the n type Si substrate 101, as shown in FIG. 6. Subsequently, the n type Si substrate 101 is cleaved, thereby completing the semiconductor laser device.

As described above, the Si substrate 101, the GaAs stress absorbing layer 102, and the GaN buffer layer 103 are doped with impurities producing the prescribed conductivity types to make these layers conductive, respectively, and the AlGaInN semiconductor layers 105 to 107, the current blocking layers 108, and the electrodes 109 and 110 are disposed on the GaN buffer layer 103 to form the semiconductor laser structure, whereby the present invention can be applied to the semiconductor laser device. Therefore, an inexpensive Si substrate can be used, thereby obtaining a semiconductor laser device with a low cost. Further, since the Si substrate can be cleaved and the electrode 109 is formed on the rear surface of the substrate, additional processing is not required in the process of fabricating the semiconductor laser device, resulting in a semiconductor laser device with a further reduced cost.

In the fourth embodiment, as the compound semiconductor layers constituting the device structure, GaN is used for the compound semiconductor layer 4 and AlGaInN is used for the compound semiconductor layers 105–107, respectively. However, compounds for these layers are not restricted to GaN and AlGaInN. Any compound semiconductor may be used as long as the composition is $Al_xGa_{1-x-y}In_yN$ ($0 \leq x \leq 1, 0 \leq y \leq 1$).

Further, in the fourth embodiment, GaN is used for the low temperature buffer layers 3 and 103. However, compounds for these layers are not restricted to GaN. Any compound semiconductor may be used as long as the composition is $Al_xGa_{1-x-y}In_yN$ ($0 \leq x \leq 1, 0 \leq y \leq 1$). In addition, the low temperature buffer layer may have a different composition from those of the compound semiconductor layers.

While in the fourth embodiment the present invention is applied to the semiconductor laser device, the present invention may be applied to a light-to-electricity conversion or an electricity-to-light conversion semiconductor device.

While in the fourth embodiment the GaAs stress absorbing layer 102 is disposed on the Si substrate 101, low bonding power layers may be disposed at regions on the Si substrate 101 and the GaAs stress absorbing layer 102 may be disposed on the low bonding power layers and a region of the Si substrate 101 where the low bonding power layers are not present. In addition, an As stress absorbing layer may be provided instead of the GaAs stress absorbing layer 102.

What is claimed is:

1. A semiconductor device comprising:
   an Si substrate having a bonding number;
   a low bonding power layer comprising a material having bonding numbers smaller than Si and disposed in a pattern covering only part of the Si substrate;
   a stress absorbing layer comprising GaAs and disposed on the low bonding power layer and on the Si substrate where the low bonding power layer does not cover the Si substrate; and
   a compound semiconductor layer having a composition of $Al_xGa_{1-x-y}In_yN$ ($0 \leq x \leq 1, 0 \leq y \leq 1$) and disposed on the stress absorbing layer.

2. The semiconductor device of claim 1 comprising:
   a buffer layer having a composition of $Al_xGa_{1-x-y}In_yN$ ($0 \leq x \leq 1, 0 \leq y \leq 1$) and disposed on the stress absorbing layer; and
   a compound semiconductor layer disposed on the buffer layer.

3. The semiconductor device of claim 1 wherein the low bonding power layer is selected from the group consisting of $SiO_x$, $SiN_x$, and SiON.

4. The semiconductor device of claim 1 wherein the low bonding power layer disposed on regions of the Si substrate includes a pattern of shapes with a dimension ranging from 0.2 to 2,000 µm.

5. The semiconductor device of claim 1 wherein the low bonding power layer has a thickness of 10 to 100 nm.

* * * * *

UNITED STATES PATENT AND TRADEMARK OFFICE
CERTIFICATE OF CORRECTION

PATENT NO. :   5,760,426
DATED      :   June 2, 1998
INVENTOR(S) :  Marx et al.

It is certified that error appears in the above-identified patent and that said Letters Patent is hereby corrected as shown below:

Item 54, Title: after "LAYER" delete --#13--.

Col. 1, line 3, after "LAYER" DELETE --#13--.

Signed and Sealed this

Twenty-ninth Day of September, 1998

Attest:

BRUCE LEHMAN

*Attesting Officer*     *Commissioner of Patents and Trademarks*